(12) United States Patent
Delacruz et al.

(10) Patent No.: US 10,823,764 B2
(45) Date of Patent: Nov. 3, 2020

(54) HALL EFFECT CURRENT SENSOR

(71) Applicant: TE CONNECTIVITY CORPORATION, Berwyn, PA (US)

(72) Inventors: Robert Steve Felisilda Delacruz, Columbus, OH (US); Frank Peter Wahl, III, Ventura, CA (US); Matthew Mishrikey, Roslindale, MA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 266 days.

(21) Appl. No.: 15/693,929

(22) Filed: Sep. 1, 2017

(65) Prior Publication Data

US 2019/0072587 A1 Mar. 7, 2019

(51) Int. Cl.
*G01R 15/20* (2006.01)
*G01R 19/00* (2006.01)

(52) U.S. Cl.
CPC .......... *G01R 15/202* (2013.01); *G01R 15/20* (2013.01); *G01R 19/0092* (2013.01)

(58) Field of Classification Search
CPC .... G01R 33/07; G01R 33/072; G01R 33/075; G01R 33/066; G01R 15/202; G01D 5/142; G01D 5/145; G01D 5/147
See application file for complete search history.

(56) References Cited

U.S. PATENT DOCUMENTS

| | | | |
|---|---|---|---|
| 4,455,515 A | 6/1984 | Uzuka | |
| 6,215,296 B1 * | 4/2001 | Arnoux | G01R 15/207 324/117 R |
| 6,316,931 B1 | 11/2001 | Nakagawa et al. | |
| 7,746,065 B2 | 6/2010 | Pastre et al. | |
| 8,232,813 B2 | 7/2012 | Burdett et al. | |
| 8,599,512 B2 | 12/2013 | Hogg | |
| 2005/0253578 A1 * | 11/2005 | Kawashima | G01D 5/145 324/207.25 |
| 2007/0096716 A1 | 5/2007 | Shoji | |
| 2007/0267978 A1 | 11/2007 | Shteynberg | |
| 2008/0048642 A1 | 2/2008 | Aratani et al. | |
| 2009/0039869 A1 | 2/2009 | Williams | |

(Continued)

FOREIGN PATENT DOCUMENTS

| | | |
|---|---|---|
| JP | H07 20218 A | 1/1995 |
| JP | 2011 017574 A | 1/2011 |
| WO | 2017 / 052676 A1 | 3/2017 |

OTHER PUBLICATIONS

International Search Report, International Application No. PCT/IB2018/056602, International Filing Date, Aug. 29, 2018.

*Primary Examiner* — Son T Le
*Assistant Examiner* — Adam S Clarke

(57) ABSTRACT

A Hall Effect sensor, including a toroid including a gap having opposed surfaces, which are substantially planar and substantially parallel to one another. The toroid further includes a central plane bisecting the opposed surfaces. A first Hall element sensor defining a first sensor plane is positioned at least partially within the gap of the toroid at a first angle and a second Hall element sensor is positioned at least partially within the gap of the toroid at a second angle substantially mutually perpendicular to each of the opposed surfaces. The central plane is substantially perpendicular to the opposed surfaces.

5 Claims, 3 Drawing Sheets

(56) References Cited

U.S. PATENT DOCUMENTS

| | | | |
|---|---|---|---|
| 2013/0073238 A1* | 3/2013 | Nomura | G01R 33/09 702/64 |
| 2015/0331067 A1* | 11/2015 | Ausserlechner | G01R 33/077 324/207.2 |
| 2016/0266172 A1 | 9/2016 | Ostrick et al. | |
| 2017/0099037 A1* | 4/2017 | Chaware | H03F 3/387 |

* cited by examiner

HALL EFFECT CURRENT SENSOR

FIELD OF THE INVENTION

The present invention is directed to Hall Effect current sensors. More particularly, the present invention is directed to Hall Effect current sensors employing at least two Hall plates.

BACKGROUND OF THE INVENTION

Hall Effect current sensors are frequently employed to measure current in a variety of applications including microelectronics. Conventional Hall sensors are unable to measure the large magnetic flux generated by currents over a few hundred Amperes without becoming saturated. An increase in the size of the Hall plate to that necessary to measure large magnetic fields is impractical.

BRIEF DESCRIPTION OF THE INVENTION

In an embodiment, a Hall Effect sensor including a toroid including a gap, the gap including opposed surfaces, the opposed surfaces being substantially planar and substantially parallel to one another, and having a central plane bisecting the opposed surfaces of the toroid. The Hall Effect sensor additionally includes a first Hall element sensor defining a first sensor plane positioned at least partially within the gap of the toroid at a first angle. The Hall Effect sensor additionally includes a second Hall element sensor positioned at least partially within the gap of the toroid at a second angle substantially mutually perpendicular to each of the opposed surfaces. The central plane of the toroid is substantially perpendicular to the opposed surfaces.

In another embodiment, a method of regulating the operation of an electrical system, the electrical system including at least one gapped ferromagnetic toroid, at least one conductive element positioned along a central axis of the toroid, at least two Hall element sensors positioned within the gap, and an amplifier circuit coupled to the at least two Hall element sensors. The method includes receiving, by the amplifier circuit, one or more first measurements, from a first Hall element sensor. The method also includes receiving, by the amplifier circuit, one or more second measurements, from a second Hall element sensor. The method also includes determining, by the amplifier circuit, a current corresponding to a current in the at least one conductive element and regulating, by the amplifier circuit, the operation of one or more actuators based on the current.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided is a Hall Effect current sensor capable of measuring large currents. Embodiments of the present disclosure, for example, in comparison to concepts failing to include one or more of the features disclosed herein, provide a Hall Effect current sensor which is able to measure the magnetic field associated with large currents.

Figure 1:
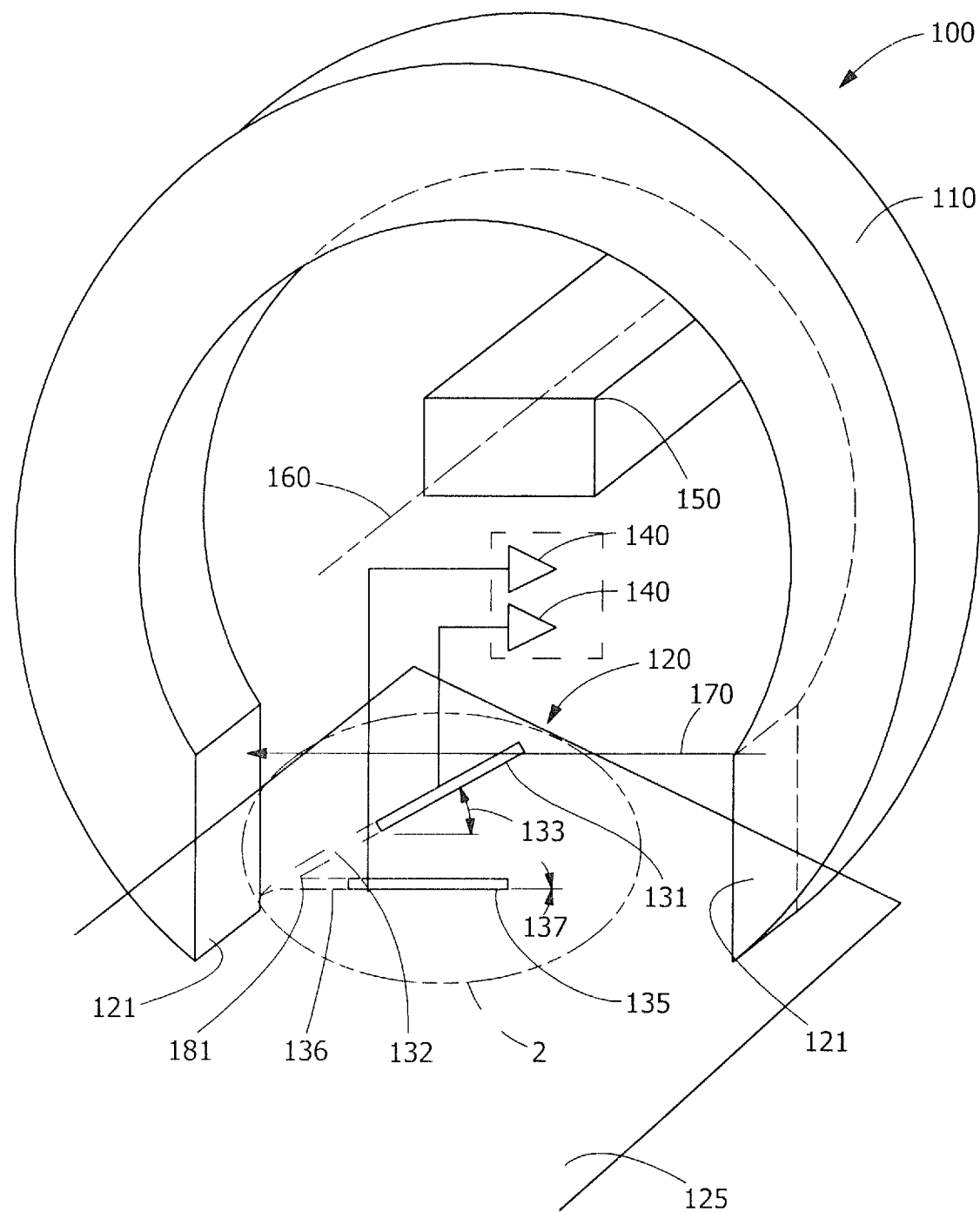
FIG. 1 is a top view of a Hall sensor according to an embodiment.

An embodiment of a Hall Effect sensor is shown in FIG. 1. The Hall Effect sensor 100 includes a toroid magnetic core 110 having a gap 120. The gap 120 includes opposed surfaces 121. The opposed surfaces 121 may be substantially planar and substantially parallel to one another. A central plane 125 bisects the opposed surfaces 121 of the toroid 110. In one embodiment, the central plane 125 bisects the toroid magnetic core 110. In some embodiments, the toroid magnetic core 110 may include at least one ferromagnetic material (e.g., ferrite, iron, metal alloys (e.g., $NiFe_{15}Mo$), amorphous soft magnetic materials (e.g., $Fe_{73}Cu_1Nb_3Si_{16}B_7$) and combinations thereof). In one embodiment, the toroid magnetic core 110 includes iron.

In the example of FIG. 1, a first Hall element sensor 131 defining a first sensor plane 132 is positioned at least partially within the gap 120 of the toroid 110 at a first angle 133 from central plane 125. For purposes herein, the term "within the gap" in the context of the toroid is meant to convey that components are contained within the three dimensional space extending between the opposed surfaces 121 of the toroid 110 and the outer peripheral surfaces that would otherwise extend between the surfaces. A second Hall element sensor 135 defining a second sensor plane 136 is positioned at least partially within the gap 120 of the toroid 110 at a second angle 137 from central plane 125. As shown, second angle 137 is coincident with central plane 125. In other words second angle 137 is zero. In some embodiments, the first Hall element sensor 131 and/or second Hall element sensor 135 may include at least one semiconductor Hall plate (e.g., gallium arsenide, indium arsenide, indium phosphide, indium antimonide, graphene, and combinations thereof).

In some embodiments, the Hall element sensors are electrically connected to at least one amplifier circuit 140 (e.g., operational amplifier (e.g., non-inverting amplifier, inverting amplifier, inverting summing amplifier, differential amplifier, Schmitt Trigger), software programmable gain amplifier (SPGA), microcontroller, microprocessor, and combinations thereof). In some embodiments, the at least one amplifier circuit 140 additionally includes a processing unit (e.g., CPU, GPU, memory, and combinations thereof). A conductive element 150 (e.g., bus bar) is arranged along a main axis 160 (e.g., a central axis) of the toroid magnetic core 110.

A current flowing through the conductive element 150 produces a principal magnetic field 170 which is concentrated in the gap 120 of the toroid magnetic core 110. The principal magnetic field 170 is substantially parallel to the central plane 125. The principal magnetic field 170 subsequently produces a voltage across at least one of the first Hall element sensor 131 and/or the second Hall element sensor 135. The voltage may be amplified by the at least one amplifier circuit 140 (e.g., non-inverting amplifier, inverting amplifier, inverting summing amplifier, differential amplifier, Schmitt Trigger, and combinations thereof).

In some embodiments, the first Hall element sensor 131 is oriented in the gap 120 at a first angle 133 relative to the central plane 125 and/or principal magnetic field 170 such that the principal magnetic field 170 results in a Hall voltage across the Hall element sensor 131. The sensitivity of the element sensor 131 may decrease as the angle of incidence of the principal magnetic field 170 deviates from 90 degrees. In some embodiments, the first angle may be an acute angle, such as, any angle greater than zero and less than 90 degrees. In some embodiments, the first angle may be less than about 85 degrees, less than about 80 degrees, less than about 75 degrees, less than about 60 degrees, less than about 50 degrees, about 45 degrees, at least about 5 degrees, at least about 10 degrees, at least about 15 degrees, at least about 30 degrees, at least about 40 degrees, and combinations thereof. In some embodiments, the first angle may be greater than 90 degrees and less than 180 degrees. In some embodiments, the first angle may be less than about 175 degrees, less than about 170 degrees, less than about 165 degrees, less than about 160 degrees, less than about 140 degrees, about 135 degrees, at least about 95 degrees, at least about 100 degrees, at least about 105 degrees, at least about 120 degrees, at least about 130 degrees, and combinations thereof.

In some embodiments, the second Hall element sensor 135 is oriented in the gap 120 at a second angle 137 relative to the central plane 125 and/or principal magnetic field 170 such that the principal magnetic field 170 results in a substantially zero Hall voltage across the second Hall element sensor 135. In some embodiments, the second Hall element sensor 135 is oriented substantially mutually perpendicular to each of the opposed surfaces 121. In some embodiments, the second angle 137 may be about 0 or about 180 degrees relative to the principal magnetic field 170. In some embodiments, a line of intersection 181 of the first sensor plane 132 and the second sensor plane 136 is substantially parallel with the opposed surfaces 121. In one embodiment, the line of intersection 181 is coincident with the central plane 125.

In some embodiments, the Hall voltage generated across the second Hall element sensor 135 may be substantially due to spurious magnetic fields. A spurious magnetic field is defined as any magnetic field incident on the first Hall element sensor 131 or the second Hall element sensor 135 that is generated by a source other than the current flowing through the conductive element 150. For example, spurious magnetic fields may be generated by sources such as nearby electrical components.

In some embodiments, the at least one amplifier circuit 140 may individually amplify the voltage signals generated by the first Hall element sensor 131 and/or the second Hall element sensor 135. In some embodiments, the at least one amplifier circuit 140 may additively combine the voltages generated by the first Hall element sensor 131 and the second Hall element sensor 135. In one embodiment, the at least one amplifier circuit 140 may combine the voltages generated by the first Hall element sensor 131 and the second Hall element sensor 135 in order to substantially eliminate voltages generated by spurious magnetic fields from the Hall voltage of the first Hall element sensor 131.

Figure 2:
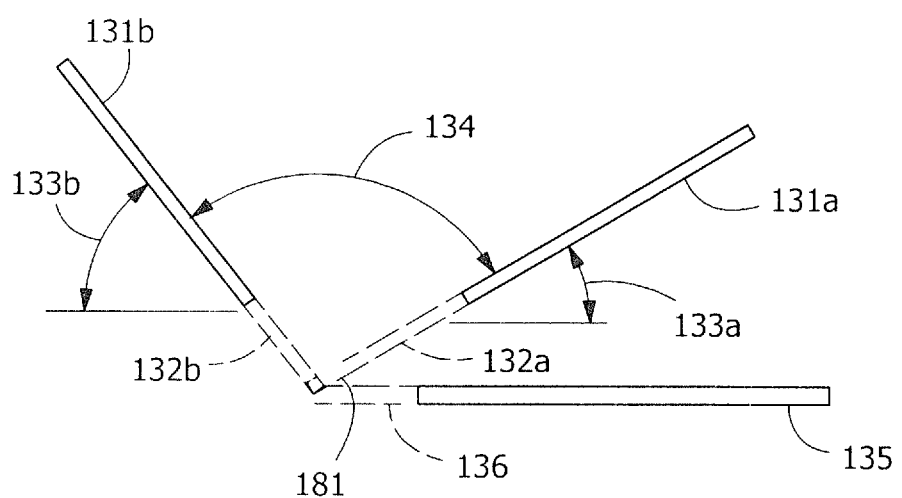
FIG. 2 is an exemplary Hall sensor arrangement from the region 2 of FIG. 1 according to an embodiment.

FIG. 2, which is an alternate embodiment of FIG. 1 and taken from region 2 of FIG. 1, utilizes a pair of first Hall element sensors 131a, 131b positioned within the gap of the toroid 110. First Hall element sensor 131a is oriented at a first angle 133a relative to the central plane 125 (FIG. 1) and/or principal magnetic field 170 such that the principal magnetic field 170 results in a Hall voltage across the Hall element sensor 131a. Additionally, first Hall element sensor 131b is oriented at an angle 134 relative to Hall element sensor 131a, such as about 15 degrees, about 30 degrees, about 45 degrees, about 60 degrees, about 90 degrees, about 120 degrees, or about 150 degrees. Other magnitudes of angle 134 may be used so long as first Hall element sensor 131b is oriented at a first angle 133b relative to the central plane 125, in which angle 133b is the same as angle 133a. Furthermore, the intersections of the second sensor plane 136 of second Hall element sensor 135, and the planes 132a, 132b of respective first Hall element sensors 131a, 131b are coincident with the line of intersection 181, which is substantially parallel with the opposed surfaces 121. In one embodiment, the line of intersection 181 is coincident with the central plane 125.

Figure 3:
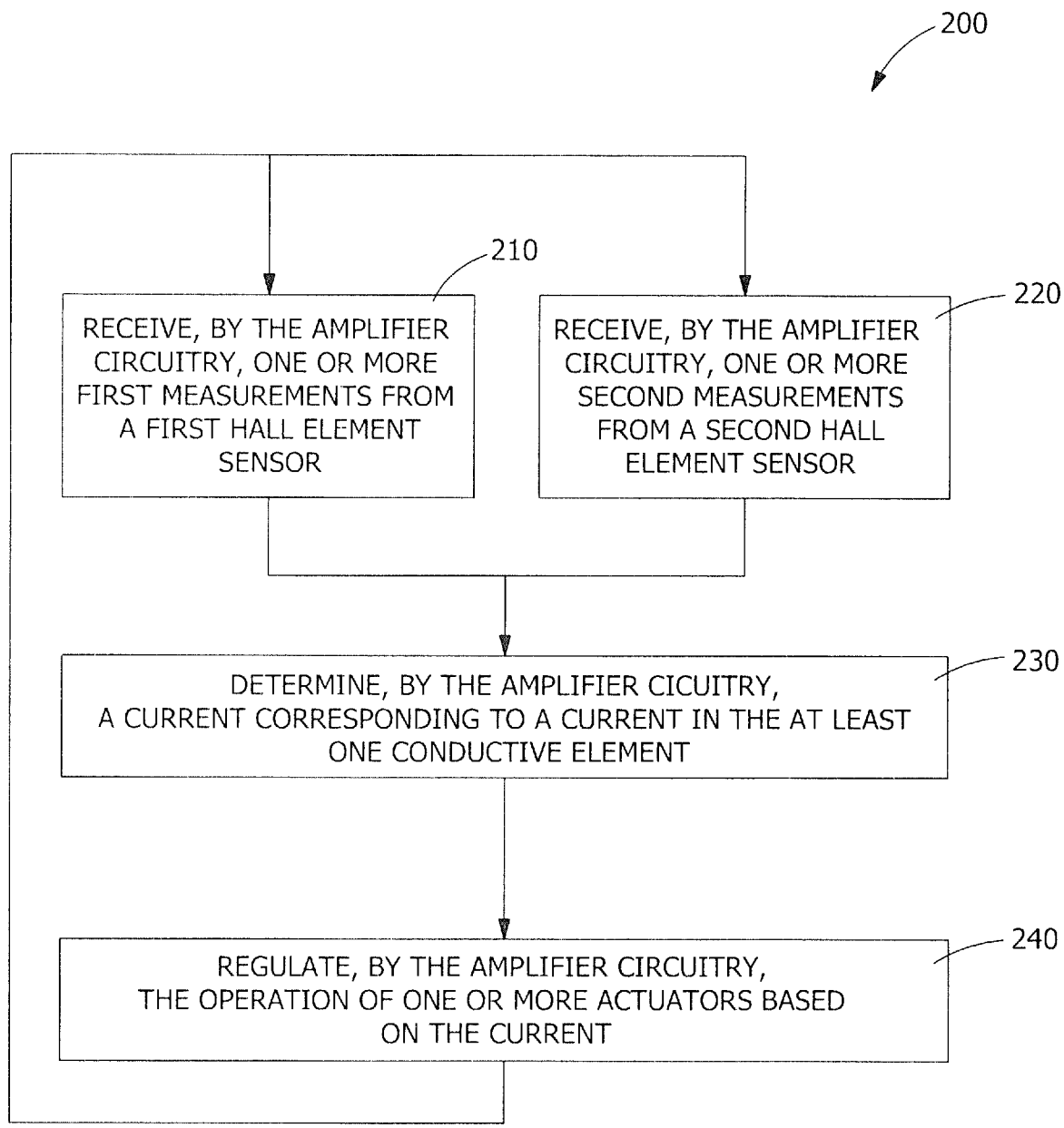
FIG. 3 is a flow chart of a method of determining current using a Hall Effect sensor according to an embodiment.

FIG. 3 is a flowchart of a method 200 of regulating the operation of an electrical system using a Hall Effect sensor 100. At block 210, the amplifier circuitry 140, receives one or more first measurements (e.g., voltage) from a first Hall element sensor 131. At block 220, the amplifier circuitry 140, receives one or more second measurements (e.g., voltage) from a second Hall element sensor 135. At block 230, the amplifier circuitry 140, determines a current corresponding to a current in the at least one conductive element 150. At block 240, the amplifier circuitry 140 regulates the operation of one or more actuators (e.g., electromechanical switch) based on the current.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A Hall Effect sensor, comprising:
a) a toroid including a gap, the gap including opposed surfaces, the opposed surfaces being substantially planar and substantially parallel to one another the toroid having a central plane bisecting the opposed surfaces;
b) a first Hall element sensor defining a first sensor plane is positioned at least partially within the gap of the toroid at a first angle from the central plane; and
c) a second Hall element sensor defining a second sensor plane is positioned at least partially within the gap of the toroid at a second angle from the central plane substantially mutually perpendicular to each of the opposed surfaces, the second sensor plane is substantially parallel with the central plane of the toroid; and
wherein the central plane is substantially perpendicular to the opposed surfaces;
wherein the first angle and the second angle are different;
wherein a line of intersection of the first sensor plane and the second sensor plane is substantially parallel with the opposed surfaces; and
wherein the line of intersection of the first sensor plane and the second sensor plane is substantially coincident with the central plane of the toroid.

2. The sensor of claim 1, wherein the first angle is an acute angle.

3. The sensor of claim 2, wherein the first angle is between 5 degrees and 85 degrees.

4. The sensor of claim 3 wherein the first angle is between 5 degrees and 45 degrees.

5. The sensor of claim 1, further comprising at least one amplifier circuit.

* * * * *